US009417268B2

(12) United States Patent
Legros

(10) Patent No.: US 9,417,268 B2
(45) Date of Patent: Aug. 16, 2016

(54) EARTH/GROUND CLAMP FOR MEASURING EARTH RESISTANCE OF ELECTRICAL INSTALLATIONS

(71) Applicant: CHAUVIN ARNOUX, Paris (FR)

(72) Inventor: Philippe Legros, Paris (FR)

(73) Assignee: CHAUVIN ARNOUX, Paris (FR)

( * ) Notice: Subject to any disclaimer, the term of this patent is extended or adjusted under 35 U.S.C. 154(b) by 665 days.

(21) Appl. No.: 13/724,081

(22) Filed: Dec. 21, 2012

(65) Prior Publication Data

US 2013/0191059 A1 Jul. 25, 2013

(30) Foreign Application Priority Data

Dec. 23, 2011 (FR) .................................... 11 62431

(51) Int. Cl.
| | |
|---|---|
| G01R 19/00 | (2006.01) |
| G01R 25/00 | (2006.01) |
| G01R 27/00 | (2006.01) |
| G01R 27/20 | (2006.01) |
| G06F 17/12 | (2006.01) |

(52) U.S. Cl.
CPC ............ *G01R 19/0007* (2013.01); *G01R 27/20* (2013.01); *G06F 17/12* (2013.01)

(58) Field of Classification Search
CPC ........... G01R 19/0007; G01R 19/0092; G01R 19/2513; G06F 17/12
USPC ..................................................... 702/64, 65
See application file for complete search history.

(56) References Cited

U.S. PATENT DOCUMENTS

| | | | | |
|---|---|---|---|---|
| 3,848,159 | A * | 11/1974 | Nye et al. ......................... | 361/45 |
| 5,969,928 | A * | 10/1999 | Hashimoto et al. ........... | 361/106 |
| 6,396,284 | B1 | 5/2002 | Tisdale et al. .................. | 324/525 |
| 6,421,618 | B1 * | 7/2002 | Kliman et al. .................. | 702/58 |
| 2008/0191705 | A1 * | 8/2008 | Bellan ............................. | 324/529 |
| 2008/0204180 | A1 * | 8/2008 | Aboumrad et al. ............. | 336/92 |
| 2010/0169034 | A1 * | 7/2010 | Reid et al. ....................... | 702/64 |
| 2010/0283491 | A1 * | 11/2010 | Zurek et al. .................... | 324/713 |
| 2011/0080177 | A1 * | 4/2011 | Beck et al. ..................... | 324/509 |

FOREIGN PATENT DOCUMENTS

EP 2249169 11/2010

* cited by examiner

*Primary Examiner* — Michael Nghiem
(74) *Attorney, Agent, or Firm* — Hamre, Schumann, Mueller & Larson, P.C.

(57) ABSTRACT

An earth clamp for testing contact voltage, comprising a measuring circuit formed of a voltage inducing transformer and a current measuring transformer, adapted to be mutually coupled by an earth conductor whose earth impedance is to be measured, a microcontroller to deliver an alternating voltage to the voltage inducing transformer and, in response, to receive a reference voltage generated in the earth conductor and an earth current $i_B+i_F$ induced in the current measuring transformer, the microcontroller being configured to extract an amplitude E of the reference voltage, an amplitude $I_B$ and an amplitude $I_F$ of the earth current and a phase shift φ between the reference voltage and the loop current $i_B$ and to calculate the earth impedance Zb at a determined frequency, the microcontroller also computing the contact voltage Uc at said determined frequency by the product of the earth impedance times the amplitude $I_F$.

12 Claims, 2 Drawing Sheets

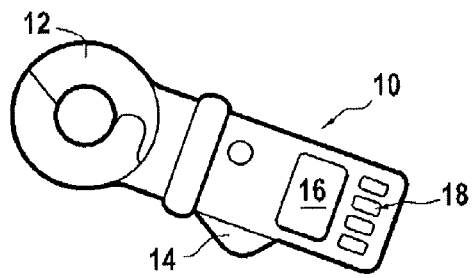
FIG.1
FIG.2A
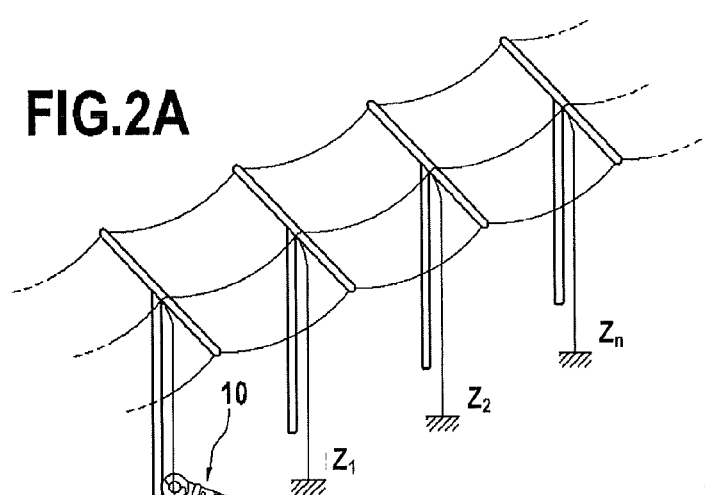
FIG.2B
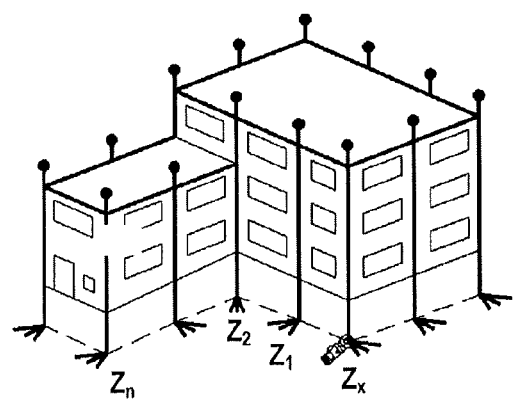
FIG.3
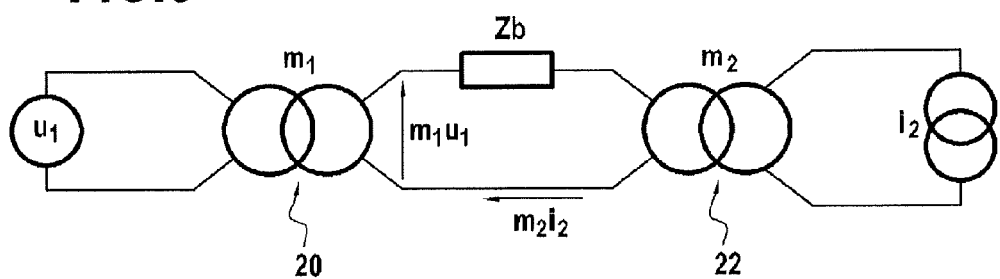

EARTH/GROUND CLAMP FOR MEASURING EARTH RESISTANCE OF ELECTRICAL INSTALLATIONS

FIELD OF THE INVENTION

The invention concerns the measurement of earth resistance of electrical installations by means of a testing device known as an earth (or ground) clamp.

PRIOR ART

The measurement of earth resistance using an earth clamp clamped around the conductor to be measured and using two separate transformers, one to inject a voltage into the loop and the other to measure the resulting current, is well known. Said measurement, which does not require the planting of auxiliary stakes, is particularly suitable when the electrical installation has multiple earth connections in parallel, forming several successive earth loops.

Therefore, mere clamping of the earthed conductor allows the testing of the quality of the earth connection by measuring the impedance of the earth loop, and allows the value of the leakage current to be measured which circulates from the electric installation to earth.

These leakage currents of greater or lesser magnitude are not without safety problems for service engineers carrying out an electrical installation or testing an installation, and who are in contact with the equipment connected to the protective conductor. Protective conductors are often non-insulated. In addition, over and above a given voltage, which varies depending on surroundings and the subject of standardisation, the insulation barrier formed by human skin might give way causing a very rapid increase in the circulation of electric current within the human body, the source of irremediable damage. This is why, to avoid this risk, it is frequent before any servicing to carry out additional tests or to measure voltage, for example using a voltmeter or a non-contact voltage tester to ensure that the voltage at the point of contact is not a source of danger for service personnel.

However, the use of said additional testing means is not always easy in installations where access to the conductors may be difficult.

OBJECTIVE AND SUMMARY OF THE INVENTION

The objective of the invention is therefore to propose an earth clamp which overcomes these disadvantages by allowing this information on contact voltage to be obtained without having recourse to external test equipment.

These objectives are achieved with an earth clamp allowing the testing of contact voltage, which comprises: a measuring circuit formed of a voltage inducing transformer comprising a split core and at least one winding with several turns m1 and a current measuring transformer comprising a split core and at least one winding with several turns m2, both adapted to be mutually coupled by an earth conductor whose earth impedance is to be measured; and a microcontroller to deliver an alternating voltage at fixed frequency Fm to said voltage inducing transformer and, in response, to receive measurement signals representing a reference voltage $V_{ref}$ generated in said earth conductor and an earth current $i_B + i_F$ (sum of a loop current $i_B$ and of a leakage current $i_F$) induced in said current measuring transformer, characterized in that said microcontroller is configured to extract by numerical computation an amplitude E of said reference voltage, an amplitude $I_B$ and an amplitude $I_F$ of said earth current and the phase shift $\phi$ between said reference voltage and said loop current $i_B$, and to deduce therefrom active Rb and reactive Lb parts at said frequency Fm of said earth impedance, so as subsequently to calculate said earth impedance at a determined frequency from said active Rb and reactive Lb parts, and in that said microcontroller further calculates said contact voltage Uc at said determined frequency using the product of said earth impedance times said amplitude $I_F$.

Therefore, by determining the contact voltage (the potential of the measurement point relative to earth) directly at the earth clamp without measuring the same, it is possible firstly to ensure true safety for persons that is much higher than that afforded by prior art devices which merely measure impedance, and secondly to obtain information on this contact voltage in a manner that is easier and quicker than the current manner which has recourse to additional testing equipment.

Advantageously, said earth impedance is calculated at an operating frequency Fs and said contact voltage Uc is obtained at said operating frequency Fs from the product of said earth impedance times said amplitude $I_F$. A sound or visual alarm can then be generated when said contact voltage exceeds a predefined threshold which can be adjustable.

Preferably, said amplitudes E and $I_B$ and said phase shift $\phi$ are obtained by digital demodulation or a Goertzel algorithm, and said amplitude $I_F$ by digital filtering.

Advantageously, said operating frequency is the mains power supply frequency and said fixed frequency is chosen from the operating bandwidth of said two transformers whilst remaining distant from said mains frequency and its harmonics.

Preferably, said voltage inducing transformer comprises two windings each surrounding a semi-core, the controlling of these two windings being ensured by two voltage amplifiers bridge-mounted and each receiving said alternating voltage at fixed frequency. A shunt resistance can be placed in series between said two windings so that, by measuring the current circulating in said voltage inducing transformer, it can detect any opening or faulty closing of said earth clamp.

Advantageously, said voltage inducing transformer further comprises two other windings each surrounding one of the two semi-cores and placed in series to measure said reference voltage and to deliver it to said microcontroller. Said reference voltage is amplified and sampled before being delivered to said microcontroller.

Preferably, said current measuring transformer comprises two windings each surrounding a semi-core, each of these two windings supplying current to a current/voltage converter whose output voltages are summed to deliver said earth current to said microcontroller.

Advantageously, before being delivered to said microcontroller, said earth current is filtered, amplified and sampled to extract said current $i_B$ therefrom.

BRIEF DESCRIPTION OF THE DRAWINGS

The invention will be better understood on reading the descriptions given below as a non-limiting illustration with reference to the appended drawings in which:

FIG. 1 is a perspective view of an earth clamp;

FIG. 2A is a view of an electric line and of the network of earths associated therewith;

FIG. 2B is a view of a building with multiple earth connections;

FIG. 3 is an ideal model of the measuring part of the earth clamp in FIG. 1.

DETAILED DESCRIPTION OF EMBODIMENTS

Figure 4:
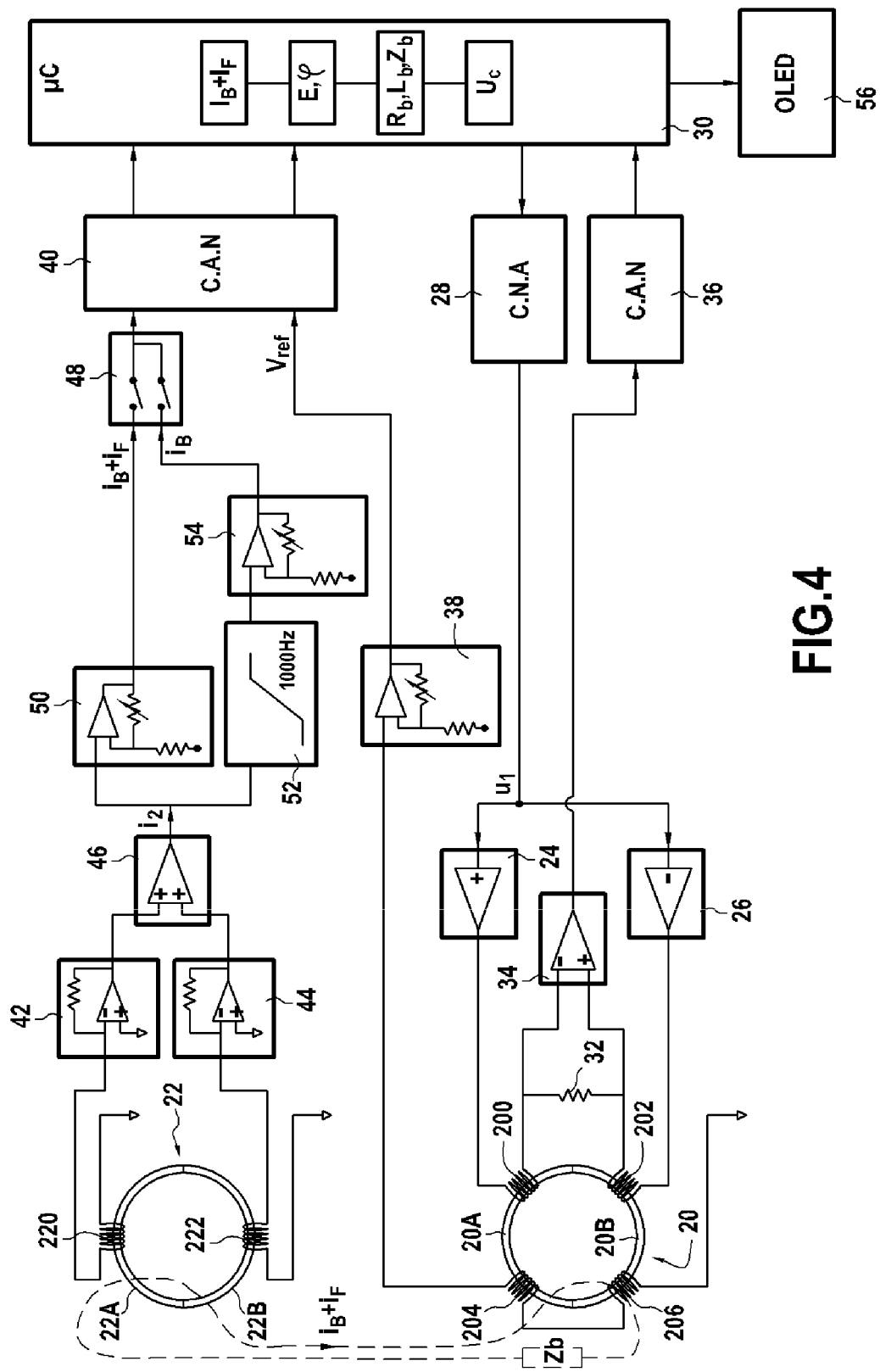
FIG. 4 is a block diagram of the earth clamp in FIG. 1.

As shown in FIG. 1, an earth clamp 10 is a portable device which an operator can hold in one hand for easy and quick testing of the earth connection of electric installations or electric cable pylons such as those illustrated in FIGS. 2A and 2B. Contrary to traditional devices, measurement using an earth clamp does not require the planting of auxiliary stakes or the opening of an earth connection (earth bar for example) insulating the electric installation.

The earth clamp has a jaw 12 which can be opened by a handle 14 and can be clamped round the earthed conductor whose earth impedance Zx it is desired to measure. The earth clamp further comprises a display screen 16 to visualize the parameters and measurement results, and different operating buttons 18 required for use thereof.

The principle of measurement using an earth clamp is schematically illustrated in FIG. 3, which shows the ideal equivalent schematic (perfect model in which instant power is preserved and iron and winding losses are not taken into account) of the measuring part of the earth clamp which is formed of the association between a voltage injection transformer (or test transformer 20 with transformation ratio m1) receiving on its primary winding an alternating voltage U1 at fixed frequency Fm and a current measuring transformer (measuring transformer 22 with transformation ratio m2) in whose secondary winding in short circuit there passes a current i2, the earth loop of loop impedance Zb forming both a one-turn winding of the secondary winding of the voltage injection transformer and a one-turn winding of the primary winding of the current measuring transformer.

The application of Faraday's laws to the windings and of Ampere's theorem to the circuit thus formed by the association of the two transformers and of the earth loop to be measured, makes it easy to show that the loop impedance Zb is then given by the following equation:

$$Zb=(m1/m2)(U1/i2) \text{ or } Zb=U1/i2 \text{ when } m1=m2$$

The amplitude of the voltage U1 is dependent on the chosen transformation ratio and the loop impedance to be measured. Therefore, with a transformation ratio of 1:200 for example, a voltage U1 of peak 12V allows the generation of a voltage called the reference voltage $V_{ref}$ of 60 mV on the earth loop. The fixed frequency Fm is chosen so as to be within the operating bandwidth of the two transformers, whilst being sufficiently distant from the mains power supply frequency and its harmonics, sources of interference. Therefore, for a mains frequency of 50 or 60 Hz for example and harmonics at 2160 (harmonic 36 of 60 Hz) or 2200 Hz (harmonic 44 of 50 Hz), the choice of an Fm at 2181 Hz proves to be a good choice since it allows these harmonics to be pushed over to 21 and 19 Hz respectively either side of this value, thereby easily allowing digital filtering of i2 at Fm±10 Hz.

The current i2 measured by the current measuring transformer 22 is the sum of a loop current $i_B$ at the fixed frequency Fm induced by the voltage tension U1 and of a leakage current $i_F$ originating from the electrical installation, in particular from electric equipment connected to the mains, and hence composed of a broadband signal comprising this mains frequency and its harmonics and optionally other composite frequencies resulting from random pulse signals (start-up of a motor for example). It will also be noted that the amplitudes of these two currents $i_B$ and $i_F$ may be very different, for example a loop current of 1.2 mA and a leakage current of 10 A.

It can also be shown that when all the earth loops form an extended earth network such as in FIGS. 2A and 2B, this loop impedance Zb is composed of the impedance Zx of the earth connection placed in series with all the other impedances Z1, Z2, Zn which in parallel are equivalent to an impedance of low value and therefore negligible compared with Zx, so that the impedance Zx is substantially equal to the loop impedance Zb (which in all cases is an upper bound of Zx) measured using the earth clamp.

FIG. 4 gives a block diagram of the earth clamp according to the invention.

The voltage inducing transformer 20 comprises two windings 200, 202 each surrounding a semi-core 20A, 20B, the controlling of these two windings being ensured by two voltage amplifiers 24, 26 bridge-mounted and each receiving the alternating voltage U1 at fixed frequency Fm. The dividing into two parts of the transformer is essential to allow the inserting of the earth conductor without having to open the earth loop. On the other hand, the recourse to two windings supplied by bridge-mounting instead of a single winding with conventional amplification is justified by the choice to obtain high accuracy of measurement with reduced electric consumption. The alternating voltage U1 is derived from the conversion by a digital/analogue converter 28 of a digital voltage delivered by the microcontroller 30.

A shunt resistance 32 is placed in series between the two windings 200, 202 so that, by measuring the current circulating in the voltage inducting transformer 20, it can detect any opening or faulty closing of said earth clamp resulting for example from the presence of dirt between the jaws of the clamp. This analogue measurement of the current is amplified via a differential amplifier 34 and converted to a digital signal by an analogue/digital converter 36 so that it can be sent to the microcontroller 30. The converters 28 and 36 are for example one-way 10- or 12-bit converters.

The voltage inducing transformer 20 further comprises two other windings 204, 206, called reference windings in the remainder of the description, each surrounding one of the two semi-cores 20A, 20B and placed in series to measure the reference voltage and deliver it to the microcontroller 30. The reference voltage is amplified by a voltage amplifier 38 and is subjected to analogue/digital conversion by an analogue/digital converter 40 before being delivered to the microcontroller 30.

The current measuring transformer 22 comprises two windings 220, 222 each surrounding a semi-core 22A, 22B, each of these two windings supplying current to a current/voltage converter 42, 44 whose output voltages are summed (in a summer 46) to deliver the earth current i2 which is then processed in two parallel acquisition pathways before being delivered to the microcontroller 30 via a two-way sampler 48. The first pathway does not filter the signal which is therefore simply amplified by a variable gain amplifier 50 (gain dependent on the measurement range) before being subjected to analogue/digital conversion, the microcontroller therefore receiving the sampled values of the sum of the currents $i_B$ and $i_F$. On the contrary, the second pathway filters the signal, for example with a second-order high-pass filter 52 having a cut-off frequency of between 600 and 1000 Hz, and then amplifies it with a variable gain amplifier 54 (gain also dependent on the measurement range) followed by analogue/digital conversion, the microcontroller then receiving the sampled values of the loop current $i_B$ and of the attenuated current $i_F$ to avoid saturation of the analogue/digital converter 40. The analogue/digital conversion is advantageously performed in one same analogue/digital converter 40 which is preferably the one already ensuring analogue/digital conversion of the reference voltage (for example a two-way 24-bit converter).

The microcontroller 30 therefore receives from the analogue/digital converter 40 sampled values of the reference voltage, of the current $i_B$ and of the sum of the currents $i_B$ and $i_F$ from which it will be able to calculate the loop impedance Zb and evidently the desired contact voltage Uc. This loop impedance will also be calculated at any operating frequency (evidently even though measurement at the measurement frequency remains possible) i.e. in general the frequency of the mains power supply (but another operating frequency e.g. at 128 Hz can also be envisaged). Each loop is effectively composed of a resistive part Rb and an inductive part Lb. When the measurement loop is large, this inductive part may prove to be non-negligible. Yet the inductive part of impedance is dependent on the measurement frequency (Z=Lω).

To do so, the microcontroller 30 performs digital demodulation, known per se, of the reference voltage at the fixed frequency Fm to obtain its amplitude E. This digital demodulation uses low-pass digital filtering, for example at 10 Hz, to eliminate interfering frequencies. Similarly, it carries out similar digital demodulation at the fixed frequency Fm of the current $i_B$ to extract therefrom the amplitude $I_B$ and the phase shift φ between the reference voltage and the current $i_B$, the amplitude $I_F$ of the current $i_F$ being obtained by simple low-pass digital filtering of the sum of the currents $i_B$ and $i_F$. The cascading of two second-order Tchebychev filters advantageously ensures the low-pass filtering of the reference voltage and of the current $i_B$ to obtain E, $I_B$ and φ, and the cascading of four fourth-order elliptic filters will give the sum of the currents $i_B$ and $i_F$ to extract the amplitude $I_F$ therefrom.

The measurements of $I_B$ and of $I_F$ are performed successively or advantageously in parallel with a measurement pair at least twice per second (display regeneration rate), measurement in parallel being more accurate than two successive measurements for which it is assumed that the two measured currents remain stable during the measurement interval.

The evaluation of loop impedance with prior art measuring devices leads to a valid value at the measurement frequency Fm, whereas this impedance will in fact have leakage currents passing through it that are mostly of lower frequencies (50 or 60 Hz and close harmonics).

Therefore, according to the invention, the loop impedance Zb is based on the following calculations:
1) Calculation of the resistive part (Rb) and inductive part (Lb) of loop impedance: Rb=E/$I_B$ cos (φ) and Lb=(½π Fm) E/$I_B$ sin (φ)
2a) Calculation of the impedance Zb as at the measurement frequency Fm: $Zb=\sqrt{(Rb)^2+(Lb.2\pi.Fm)^2}$ or as a preferred variant,
2b) Calculation of the impedance Zb as at the mains frequency Fs:
$Zb=\sqrt{(Rb)^2+(Lb.2\pi.Fs)^2}$ The contact voltage Uc is then evaluated from the loop impedance Zb and from $I_F$ either at the measurement frequency or preferably at Fs: Uc=Zb $I_F$.

Therefore, the earth clamp gives information, at a given instant, on the value of the leakage current ($i_F$), and on an upper bound of the earthing impedance ($Z_b \geq Z_x$), so that it is possible to provide two additional data items to the user relating to safety:
1) an upper bound of the value of the contact voltage at the point of measurement,
2) an alarm 56 (visual and/or sound) in the event of overstepping a predefined threshold, which may be adjustable, of the contact voltage.

It will be noted that other known digital methods such as passband digital filtering or a Goertzel algorithm could have been used in lieu and stead of the digital demodulation to obtain E and $I_B$ as well as the phase shift φ.

The invention claimed is:
1. An earth clamp device for determining a contact voltage, comprising:
a measurement circuit formed of a voltage inducing transformer and a current measuring transformer,
the voltage inducing transformer comprising a split core and a first winding with several turns about the split core, and a second winding with several turns about the split core, and
the current measuring transformer comprising another split core and at least one winding with several turns about the another split core,
wherein both of the voltage inducing transformer and the current measuring transformer are adapted to be mutually coupled by an earth conductor whose earth impedance is to be measured;
a display screen; and
a microcontroller connected to the measurement circuit and the display screen, the microcontroller delivers an alternating voltage at a fixed frequency $F_m$ to the first winding of the voltage inducing transformer, and then in response, receives measurement signals at the fixed frequency $F_m$ representing:
a reference voltage $V_{ref}$ generated in the earth conductor at the second winding of the voltage inducing transformer, and
an earth current which is a sum of a loop current $i_g$ and a leakage current $i_F$ induced in the current measuring transformer, the microcontroller extracts
an amplitude E of the reference voltage $V_{ref}$,
an amplitude $I_B$ of the loop current,
an amplitude $I_F$ of the leakage current, and
a phase shift φ between the reference voltage $V_{ref}$ and the loop current $i_B$, and
the microcontroller determines resistive $R_b$ and inductive $L_b$ parts at the fixed frequency $F_m$ of the earth impedance,
the microcontroller further determines the earth impedance $Z_b$ at a determined frequency using the active $R_b$ and reactive $L_b$ parts, and
the microcontroller further determines the contact voltage Uc at the determined frequency from a product of the earth impedance and the amplitude $I_F$, and the microcontroller displays the contact voltage Uc on the display screen.

2. The earth clamp device according to claim 1, wherein the determined frequency is an operating frequency Fs, and the microcontroller determines the contact voltage Uc at the operating frequency Fs.

3. The earth clamp device according to claim 2, wherein the operating frequency Fs is a mains power supply frequency.

4. The earth clamp device according to claim 3, wherein said fixed frequency Fm is in the operating bandwidth of the voltage inducing transformer and the current measuring transformer, and the fixed frequency Fm is distant from the mains power supply frequency and harmonics of the mains power supply frequency.

5. The earth clamp device according to claim 1, further comprising a sound or visual alarm that is connected to the microcontroller, wherein the microcontroller generates the sound or visual alarm when the microcontroller determines that the contact voltage exceeds a predefined threshold, wherein the predefined threshold can be adjustable.

6. The earth clamp device according to claim 1, further comprising:
a first voltage amplifier; and
a second voltage amplifier,
wherein the voltage inducing transformer further comprises another winding with several turns about the split core,
the first winding of the voltage inducing transformer is arranged on a first semi-core of the split core, and the another winding of the voltage inducing transformer is arranged on a second semi-core of the split core, the first winding being connected to the first voltage amplifier, wherein the first voltage amplifier is arranged between the microcontroller and the first winding, the another winding connected to the second voltage amplifier, wherein the second voltage amplifier is arranged between the microcontroller and the another winding, the first voltage amplifier and the second voltage amplifier are bridge-mounted to receive from the microcontroller the alternating voltage at the fixed frequency Fm and then respectively transmit amplified alternating voltages to the first winding and the another winding.

7. The earth clamp device according to claim 6, further comprising a shunt resistor arranged in series between the first winding and the another winding so that, by measuring a current circulating in the voltage inducing transformer, the microcontroller can detect any opening or faulty closing of the earth clamp device.

8. The earth clamp device according to claim 1, wherein the voltage inducing transformer further comprises another winding, the second winding of the voltage inducing transformer is arranged on a first semi-core of the split core, and the another winding of the voltage inducing transformer is arranged on a second semi-core of the split core, and the second winding and the another winding are placed in series to measure the reference voltage $V_{ref}$ and to deliver the reference voltage $V_{ref}$ to the microcontroller.

9. The earth clamp device according to claim 8, further comprising:

a voltage amplifier arranged between the voltage inducing transformer and the microcontroller; and an analogue/digital converter arranged between the voltage inducing transformer and the microcontroller, wherein the reference voltage $V_{ref}$ is amplified by the voltage amplifier, and sampled by the analogue/digital converter before being delivered to the microcontroller.

10. The earth clamp device according to claim 8, further comprising:

a filter connected to the current measuring transformer;

an amplifier connected to the filter, and arranged between the filter and the microcontroller; and an analogue/digital converter connected to the amplifier, and arranged between the amplifier and the microcontroller, wherein the earth current is filtered by the filter to extract the current $i_B$, and then the current $i_B$ is amplified by the amplifier, and then sampled by the analogue/digital converter, before being delivered to the microcontroller.

11. The earth clamp device according to claim 1, further comprising:

two current/voltage converters; and a summer arranged to sum output voltages from the two current/voltage converters, wherein the current measuring transformer comprises two windings, each of the two windings surrounding a different semi-core of the another split core with respect to each other, each of these two windings supplying current to a respective one of the two current/voltage converters, and the output voltages that are summed by the summer being delivered to the microcontroller.

12. An earth clamp device for determining a contact voltage, comprising:

a measurement circuit formed of a voltage inducing transformer and a current measuring transformer, the voltage inducing transformer comprising a split core and a first winding with several turns about the split core, and a second winding with several turns about the split core, and the current measuring transformer comprising another split core and at least one winding with several turns about the another split core, wherein both of the voltage inducing transformer and the current measuring transformer are adapted to be mutually coupled by an earth conductor whose earth impedance is to be measured;

a display screen;

a microcontroller connected to the measurement circuit and the display screen, the microcontroller delivers an alternating voltage at a fixed frequency $F_m$ to the first winding of the voltage inducing transformer, and then in response, receives measurement signals at the fixed frequency $F_m$ representing:

a reference voltage $V_{ref}$ generated in the earth conductor at the second winding of the voltage inducing transformer, and an earth current which is a sum of a loop current $i_B$ and a leakage current $i_F$ induced in the current measuring transformer, the microcontroller extracts by digital demodulation or a Goertzel algorithm the following:

an amplitudes E of the reference voltage $V_{ref}$, an amplitude $I_B$ of the loop current, and a phase shift ϕ between the reference voltage $V_{ref}$ and the loop current $i_B$; and the microcontroller receives measurement signals from the measurement circuit and extracts an amplitude $I_F$ of the leakage current $i_F$ by digital filtering the measurement signals, the microcontroller determines resistive $R_b$ and inductive $L_b$ parts at the fixed frequency $F_m$ of the earth impedance, the microcontroller further determines the earth impedance $Z_b$ at a determined frequency using the active $R_b$ and reactive $L_b$ parts, and the microcontroller further determines the contact voltage Uc at the determined frequency from a product of the earth impedance and the amplitude $I_F$, and the microcontroller displays the contact voltage Uc on the display screen.

* * * * *